United States Patent [19]
Drexler

[11] Patent Number: 6,145,742
[45] Date of Patent: Nov. 14, 2000

[54] METHOD AND SYSTEM FOR LASER WRITING MICROSCOPIC DATA SPOTS ON CARDS AND LABELS READABLE WITH A CCD ARRAY

[75] Inventor: Jerome Drexler, Los Altos Hills, Calif.

[73] Assignee: Drexler Technology Corporation, Mountain View, Calif.

[21] Appl. No.: 09/389,397

[22] Filed: Sep. 3, 1999

[51] Int. Cl.[7] ................................................. G06K 7/10
[52] U.S. Cl. .................................... 235/454; 235/375
[58] Field of Search ........................... 235/454, 462.01, 235/472.01, 493, 494, 375, 462.02

[56] References Cited

U.S. PATENT DOCUMENTS

| | | | |
|---|---|---|---|
| 4,230,939 | 10/1980 | de Bont et al. | 235/488 |
| 4,269,917 | 5/1981 | Drexler et al. | 430/16 |
| 4,278,756 | 7/1981 | Bouldin et al. | 430/414 |
| 4,278,758 | 7/1981 | Drexler et al. | 430/616 |
| 4,298,684 | 11/1981 | Bouldin et al. | 430/616 |
| 4,304,848 | 12/1981 | Bouldin et al. | 430/401 |
| 4,314,260 | 2/1982 | Drexler | 346/76 L |
| 4,476,468 | 6/1983 | Goldman | 340/825.34 |
| 4,503,135 | 3/1985 | Drexler | 430/12 |
| 4,542,288 | 9/1985 | Drexler | 235/487 |
| 4,603,099 | 7/1986 | Drexler | 430/140 |
| 4,634,850 | 1/1987 | Pierce et al. | 235/487 |
| 4,680,459 | 7/1987 | Pierce et al. | 235/487 |
| 4,745,484 | 5/1988 | Drexler et al. | 358/227 |
| 4,757,329 | 7/1988 | Sato et al. | 235/488 |
| 4,786,792 | 11/1988 | Pierce et al. | 235/456 |
| 4,814,594 | 3/1989 | Drexler | 235/487 |
| 4,864,630 | 9/1989 | Arnold et al. | 382/46 |
| 4,958,065 | 9/1990 | Weinberger | 235/488 |
| 5,001,696 | 3/1991 | Balwin | 364/521 |
| 5,124,535 | 6/1992 | Kocznar et al. | 235/382 |
| 5,237,164 | 8/1993 | Takada | 235/487 |
| 5,243,655 | 9/1993 | Wang | 380/51 |
| 5,304,786 | 4/1994 | Pavlidis et al. | 235/462 |
| 5,319,181 | 6/1994 | Shellhammer et al. | 235/462 |
| 5,421,619 | 6/1995 | Dyball | 283/86 |
| 5,471,263 | 11/1995 | Odaka | 352/27 |
| 5,523,996 | 6/1996 | Kubota et al. | 369/124 |
| 5,543,868 | 8/1996 | Tachi | 352/27 |
| 5,666,185 | 9/1997 | Odaka | 352/27 |
| 5,710,752 | 1/1998 | Seagrave et al. | 369/97 |
| 5,932,865 | 8/1999 | Drexler | 235/487 |

FOREIGN PATENT DOCUMENTS

| | | | |
|---|---|---|---|
| 0254371 | 12/1985 | Japan | 235/380 |
| 8-30744 | 2/1996 | Japan | 235/454 |

OTHER PUBLICATIONS

J.M. Fleischer et al., "Laser–Optical System of the IB 3800 Printer", IBM Journal of Research and Development, Sep. 1997, pp. 479–483.

H.G. Craighead et al., "Textured optical storage media", SPIE vol. 329 Optical Disk Technology (1982), pp. 202–205.

*Primary Examiner*—Thien M. Le
*Attorney, Agent, or Firm*—Thomas Schneck

[57] ABSTRACT

A method and system for recording and storing digital data on optical memory cards and labels using laser recording of optical storage media to create updatable, high resolution, two-dimensional bar codes, storing about 15 to more than 500 times as much digital data as the widely-adopted PDF-417, two-dimensional bar code. The optical storage media is of the DRAW (direct-read-after-write) type which requires no post processing. The optical storage media is pre-formatted with tracks to precisely locate the recorded microscopic data spots. Groups of these microscopic data spots form data bars which in turn form data pixels whose dimensions are at least four times greater linearly and 16 times greater in area than the microscopic data spots. The data pixels can be read with photodetector arrays such as CCD arrays.

20 Claims, 3 Drawing Sheets

METHOD AND SYSTEM FOR LASER WRITING MICROSCOPIC DATA SPOTS ON CARDS AND LABELS READABLE WITH A CCD ARRAY

TECHNICAL FIELD

The present invention relates to a method and system of laser writing microscopic data spots on optical memory cards and labels which are readable with a photodetector array such as a CCD array.

BACKGROUND ART

Laser recording of digital data can be on rotating optical memory disks or optical media that is moving linearly as with optical memory cards or optical memory tape. The commercial fields for linear optical data storage include optical memory cards, two-dimensional bar codes, and digital sound on motion picture films.

The PDF-417 (Portable Data File), two-dimensional bar code has become a widely accepted way of storing data on cards, documents, and packages. It is used to encode graphics, including fingerprints. It has begun to be used as a form of postage stamp printed by a laser printer connected to a personal computer following authorization over the Internet. The PDF-417 specification was disclosed in 1991. PDF-417 utilizes images with minimum dimensions of about 150 microns. An earlier, higher resolution form of two-dimensional bar code was disclosed in U.S. Pat. No. 4,634,850 entitled, "Quad Density Optical Data Systems," assigned to Drexler Technology Corporation, which was filed Nov. 4, 1985, and issued Jan. 6, 1987. A closely related patent is U.S. Pat. No. 4,786,792 issued Nov. 22, 1988, which is also assigned to Drexler Technology corporation. These two patents relate to reading a high-resolution form of two-dimensional bar codes with image dimensions of 3 to 35 microns compared with the 150-micron image dimension of PDF-417. Examples of patents directly related to the PDF-417 system are U.S. Pat. Nos. 5,243,655, 5,304,786, and 5,319,181 filed from 1990 to 1992 and issued 1993 and 1994, which are assigned to Symbol Technologies Inc.

Three patents have been assigned to Drexler Technology Corporation which involve the laser recording on reflective optical data storage medium using a microscopic laser beam of one to a few microns in diameter to create eye-visible images formed from pixels (picture elements), which in turn are formed from groups of 4, 9, or 16 closely-spaced laser-recorded microscopic spots. These pixels are used to create visual alpha-numeric characters or images, including portrait images of people. The three Drexler Technology patents are U.S. Pat. No. 4,680,459 entitled, "Updatable Micrographic Pocket Data Card," U.S. Pat. No. 4,814,594 entitled, "Updatable Micrographic Pocket Data Card," and U.S. Pat. No. 5,421,619 entitled, "Laser Imaged Identification Card." Methods and apparatus involving linear optical data storage of data on motion picture film are described in the following seven U.S. patents. In these cases the digital optical data represents motion picture digital sound. Two of those patents, assigned to Drexler Technology, are U.S. Pat. Nos. 4,503,135 and 4,603,099. Patents assigned to Sony Corporation in this field include U.S. Pat. Nos. 5,471,263, 5,523,996, 5,543,868, and 5,666,185. One of the relevant motion picture sound patents assigned to Dolby Laboratories is U.S. Pat. No. 5,710,752.

Another relevant patent is recently-issued U.S. Pat. No. 5,932,865 assigned to Drexler Technology Corporation, which is entitled, "Anti-Counterfeit Validation Method for Electronic Cash Cards Employing an Optical Memory Stripe." Two sentences in the abstract point out the relevant features of this patent; namely, "Such counterfeiting can be inhibited by bonding an optical memory stripe to the smart card with pre-recorded or post-recorded validation data on the card. This optical validation data would be read with a photodetector array and could be transmitted to the recipient during funds transfer and/or used locally to control dispensing of cash." This patent explains the importance of laser recording data which are readable with CCD arrays, but does not disclose the method of the present invention.

Typical optical memory cards utilize a 35 mm-wide, reflective optical memory recording stripe which stores about 4 megabytes of data when 2.5 micron spots and 12 micron track-to-track spacings are used. The reader/writer device sells for about $2,500, and read-only devices for those cards are also expensive because of the precision required to track the digital data on the optical card with a low power laser diode. Customers have requested an inexpensive, read-only device for the optical memory cards, and it is believed some customers would probably accept a somewhat lower data-storage-capacity card if that would lead to an inexpensive read-only device.

It is the object of the present invention to devise a method and apparatus for laser recording of a two-dimensional bar code readable with CCD or other photodetector arrays and with data storage capacities ranging from about 15 to more than 500 times greater than that of PDF-417 bar codes. Another object is to utilize data-pixel-based two-dimensional bar codes on cards or labels for authentication, validation, authorization, or identification of Internet and Intranet transactions, documents, communications, and manufactured products. Another object of the invention is to devise a method and apparatus to make CCD-read data-pixel-based two-dimensional bar codes updatable. Another object is for an optical memory card to be utilized in reading and writing microscopic data spots during some time periods and writing and reading large data pixels with the same card during other time periods.

DISCLOSURE OF THE INVENTION

The above objectives have been met by a pre-formatted, laser-recordable optical memory stripe being bonded to a plastic card, or to a plastic card containing a microchip or magnetic stripe, or to a label medium coated with an adhesive. The laser recording material should be of the DRAW (direct-read-after-writing) type where laser data is instantly recorded without a post processing operation. The pre-formatted data tracks on the optical memory stripe would be separated by a distance of about 7 microns to 20 microns and preferably, to accommodate existing commercial equipment such spacing should be about 12 microns, which represents an ISO standard for optical memory cards.

The laser-recorded microscopic data spots are defined as in the range of between 0.6 microns to 3 microns in diameter but more typically for optical memory cards at about 2.5 microns in diameter.

Whereas read-only devices utilizing laser tracking of pre-formatted tracks are expensive, a read-only device using a linear CCD array to read multiple tracks encompassing large data pixels can be inexpensive under the right design conditions. To minimize data errors, at least two or three photosensitive detectors of the photodetector array should read each data pixel. The use of 7- to 10-micron size data spots with a CCD array would work technically but might not lead to the lowest price read-only device today, owing to the cost of the required CCD array. CCD arrays become lower in cost when the size of the data spots being read are greater than 10 microns, but data storage capacity of an optical memory card is reduced for larger data spots by the square of the data spot size.

The objects of the invention are achieved by creating an array of uniform data spot pixels, or simply data pixels, whose linear size might be as small as seven microns or greater than 50 microns by use of properly arranged groups of spots, preferably about 2.5 microns in diameter. Smaller spots can be used, but then more of them would have to be utilized to create the large data pixels. Larger spots could be used, but laser diodes have limited output powers, and spreading the beam to larger diameters would reduce recording efficiency. The method involves the recording of a series of 2.5 micron spots in sequence without the normal 2.5 micron spacing between them so as to create a continuous data bar of lower reflectivity, for example, 25 microns long and 2.5 microns wide. For commercial optical memory cards, the recorded spots are recorded in the center of the 10-micron wide, highly reflective flat track defined by a 2-micron wide, low reflectivity border region along each edge of the 10-micron wide data track. Thus the center-to-center spacing between spots centered in adjacent tracks is 12 microns. Since the goal is to transform a 10 micron by 25 micron region of a track from high reflectivity to low reflectivity to create a data pixel, the first 2.5 micron by 25 micron bar may not necessarily be recorded in the center of the 10-micron track. Recording it anywhere in the track leaves room for a second, and probably a third, 2.5 micron by 25 micron bar to be recorded in the same track. Thus in that 25-micron long, 10-micron wide reflective track, 5 to 7.5 microns of width are taken up by the low reflectivity laser-recorded data bars. The remaining unrecorded track would remain at a high reflectivity, perhaps in the range of 40% to 50%. reflectivity, while the laser-recorded data bars might have a reflectivity of about 10%.

By this procedure, a lowered reflectivity region is created of about 12 microns in width and 25 microns in length. To create the desired 24 micron by 25 micron data pixel, the above procedure must be repeated with one adjacent track containing two to three similar low reflectivity data bars. One 24 micron by 25 micron data pixel is thus created by four to six laser-recorded data bars 2.5 microns wide and 25 microns long, distributed over two adjacent tracks with two to three of the low reflectivity data bars in each track. This lowered reflectivity 24 micron by 25 micron region is designated a data pixel and would represent a binary "one," while a similar size, high reflectivity data pixel without any laser recorded data bars would represent a binary "zero." The objective would be for the contrast ratio between the reflectivity of a "one" data pixel and the reflectivity of a "zero" data pixel to be in the range of about 1.5:1 to 2:1, which would be sufficient for data detection with low error rate.

The use of a large data pixel reduces the typical data capacity of four megabytes for an optical memory card with a 35 mm storage stripe on it. For example, a 24 micron by 25 micron data pixel would normally contain five data spots per track, and thus the two tracks would normally have contained ten data spots where now there is only one data pixel. Thus for the 24 by 25 micron pixel, the data pixel storage capacity of the same optical memory card would be reduced to about a factor of 10 to 400 kilobytes for a 35 mm-wide optical stripe and to about 180 kilobytes for a 16 mm-wide optical stripe.

The data storage capacity has been reduced. However, for a 16 mm stripe, it is 90 times greater than the two kilobytes stored on plastic cards using a PDF-417 patch and 22 times greater than the 8-kilobyte storage of a microchip smart card. The data storage capacity increases to about 1600 kilobytes for a 35 mm stripe and about 720 kilobytes for a 16 mm stripe if a data pixel size of 12.5 microns by 12 microns is used.

The method and apparatus for reading the data pixels from a data-pixel card or data-pixel label will involve either CCD arrays or other photodetector arrays. The photodetector array could be of the linear variety, in which case the card would have to be in motion when read. In the case of a two-dimensional photodetector array the card would not require motion but instead would be scanned electronically. The use of two-dimensional CCD arrays to read data from an optical memory is described in U.S. Pat. Nos. 4,745,484 and 4,864,630. The use of a linear photodetector array to read optical memory is described in U.S. Pat. No. 4,634,850.

A standard four-megabyte optical memory card can be used with a standard card reader/writer to create a data-pixel card. The desired data can be recorded on a card as 2.5 micron data spots. Then a software program would be loaded into a PC which controls the card reader/writer which would read the desired data on the card and in a step-by-step process translate the microscopic spot data into the data pixel format. That data can then be used to record the data on the same card or another card in the form of large data pixels.

The use of the laser-created large data pixels in conjunction with a CCD array to read the pixels is estimated to reduce the cost of the read-only device by a factor of four from a laser-based, read-only device tracking 2.5 micron data spots. It also permits the read-only device to be portable for use, for example, in reading personally-carried medical records in an ambulance, or by military medics, or in the event of automobile accidents or other catastrophes. The use of the data pixels permits border crossing visa cards to be read in the field by inspectors, and for digital driver's licenses to be checked for validity easily. A small, inexpensive, read-only device would open the optical memory card market to pay-per-use home T.V. and Internet services and to authorize purchases by welfare recipients in retail establishments. Also, data-pixel-based two-dimensional bar codes on cards or labels can be used for authentication, validation, authorization, or identification of Internet E-Commerce transactions, documents, communications, and manufactured products.

Another object of the invention is to devise a method and system to make CCD-read data-pixel-based two-dimensional bar codes updatable. This is accomplished by utilizing a laser-recordable optical memory card that uses a DRAW (direct-read-after-write) laser recording material. A DRAW material records immediately after laser beam exposure and does not require a processing operation like photographic film. The optical memory card is preferably formatted to facilitate the recording of the microscopic data spots precisely in the required locations, which will be grouped into data pixels. By recording of the initial amount of data which does not fill the data capacity of the card, at a later time new data may be added. As indicated previously, a 16 mm optical stripe on a commercially-available optical memory card using 24 by 25 micron data pixels would store 180 kilobytes of data, representing about 90 single-spaced typewritten pages. Thus, for example, if the equivalent of five typewritten pages were recorded for each data entry, a total of 18 such data entries could be made.

Another object is for an optical memory card to be utilized in reading and writing microscopic data spots during some time periods and writing and reading large data pixels during other time periods. This is accomplished by using a laser-recordable, pre-formatted optical memory card which uses a DRAW (direct-read-after-write) material. The pre-formatting of recording tracks and separator bands can be accomplished by molding, pressing, or by the methods described in U.S. Pat. Nos. 4,542,288 and 4,304,848, assigned to Drexler Technology Corporation. The DRAW material is important, since it requires no post-processing after laser recording and therefore permits hundreds and thousands of data entries over months or years. The track pre-formatting on the optical memory card is desirable since it facilitates precise location of the laser-written microscopic data spots so they can later be precisely aligned into groups of data spots that create the required large data pixels. The standard for commercial optical memory cards is to record the microscopic spots on the tracks at the lower end of the optical memory stripe first. Thus to accommodate writing and reading both microscopic data spots and the large data pixels, the latter should be recorded on the upper tracks. By this means, a 35 mm optical stripe using 2.5 micron data spots and 24 by 25 micron data pixels could record and store, for example, about two megabytes of microscopic data spots and about 200 kilobytes of data pixels.

When an optical memory card is subject to severe environmental conditions or misuse such as scratching, high temperature, moisture, chemical or ultraviolet light exposure, particularly over extended periods of time, some of the microscopic data spots can be lost. Error detection and correction (EDAC) systems are usually used to compensate for such situations. Also, additional microscopic spot data can be recorded redundantly on the card as a backup to the primary data in the event that critical data is lost. An even more secure approach to the problem is to record some of the critical data redundantly in the form of large data pixels on the same card. Thus if the primary critical data is lost, the large data pixels can be used for recovery.

BEST MODE FOR CARRYING OUT THE INVENTION

Figure 1:
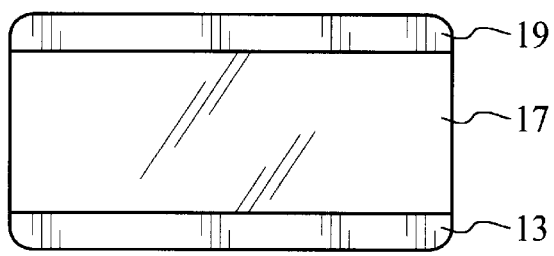
FIG. 1 is a top plan view of a data card of the present invention.

With reference to FIG. 1, an optical memory card 11 is illustrated having a size common to most credit cards. The card's substrate material 13 is a dielectric, usually a plastic. Polycarbonate is preferred. The surface finish of the base should have low specular reflectivity, preferably less than 10%.

Substrate 13 carries strip 17. The strip is typically 35 mm or 16 mm wide and extends the length of the card. Alternatively, the strip may have other sizes and orientations. The strip is relatively thin, typically 60–200 microns, although this is not critical. Strips of laser recording material may be applied to both sides of card 11. The strip may be applied to the card by any convenient method which achieves flatness.

Figure 2:
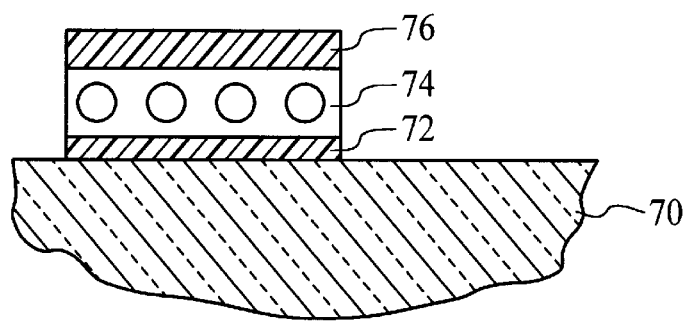
FIG. 2 is a side elevation detail of the data card of FIG. 1.

The strip 17 is adhered to the card with an adhesive and is covered by a transparent laminating sheet 76 seen in FIG. 2 which serves to keep strip 17 flat, as well as protecting the strip from dust and scratches. Sheet 76 is a thin, transparent plastic sheet laminating material or a coating, such as a transparent lacquer. The material is preferably made of polycarbonate plastic.

The high resolution laser recording material 74 which forms strip 17 may be any of the reflective recording material which have been developed for use as direct-read-after-write (DRAW) optical disks, so long as the materials can be formed on thin substrates. An advantage of reflective materials over transmissive materials is that the read/write equipment is all on one side of the card, the data storage capacity can be doubled by using both sides, and automatic focus is easier. For example, the high resolution material described in U.S. Pat. No. 4,230,939 issued to de Bont, et al. teaches a thin metallic recording layer of reflective metals such as Bi, Te, Ind, Sn, Cu, Al, Pt, Au, Rh, As, Sb, Ge, Se, Ga.

Materials which are preferred are those having high reflectivity and low melting point, particularly Cd, Sn, Ti, Ind, Bi, and amalgams. Suspensions of reflective metal surfaces in organic colloids also form low melting temperature laser recording media. Silver is one such metal. Typical recording media are described in U.S. Pat. Nos. 4,314,260, 4,298,684, 4,278,758, 4,278,756 and 4,269,917, all assigned to the assignee of the present invention.

The laser recording material which is selected should be compatible with the laser which is used for writing on it. Some materials are more sensitive than others at certain wavelengths. Good sensitivity to near infrared light is preferred because near infrared is affected least by scratches and dirt on the transparent laminating sheet. The selected recording material should have a favorable signal-to-noise ratio and form high contrast data bits with the read/write system with which it is used.

The material should not lose data when subjected to temperatures of about 180° F. (82° C.) for long periods. The material should also be capable of recording at speeds of at least several thousand bits/second. This generally precludes the use of materials that require long heating times or that rely on slow chemical reactions in the presence of heat, which may permit recording of only a few bits/second. A large number of highly reflective laser recording materials have been used for optical data disk applications.

Data is recorded by forming microscopic data spots in the field of the reflective layer itself, thereby altering the reflectivity in the data spot. Data is read by detecting the optical reflective contrast between the surrounding reflective field of unrecorded areas and the recorded spots. Spot reflectivity of less than half the reflectivity of the surrounding field produces a contrast ratio of at least two to one, which is more than sufficient contrast for reading. Reflectivity of the strip field of about 40% to 50% is preferred with reflectivity of a spot in the reflective field being less than 10%, thus creating a contrast ratio of four or five to one. Alternatively, data may also be recorded by increasing the reflectivity of the strip. For example, the recording laser can melt a field of dull microscopic spikes on the strip to create flat, shiny spots. This method is described in SPIE, Vol. 329, Optical Disk Technology (1982), p. 202. A spot reflectivity of more than twice the surrounding spiked field reflectivity produces a contrast ratio of at least two to one, which is sufficient contrast for reading.

Data strip 17 is intended to provide a data record and has digital information indicia. Digital J machine readable data is written in individual tracks extending in a longitudinal direction, as indicated by the spot patterns 19 and are usually read in reflection, rather than in transmission. The information density is great because each of the spots in the spot pattern is approximately 0.6 to 3 microns in diameter with a typical spacing of about 0.6 to 3 microns between spots. The spots are recorded by a laser in the usual way, for example, as shown in U.S. Pat. No. 4,278,756 to Bouldin et al.

With reference to FIG. 2, a card substrate 70 carries an optional secondary substrate 72 which is a thin flexible material, only a few mils thick carrying a laser recording material 74. The secondary substrate 72 is adhered to the primary substrate 70 by means of an adhesive or sticky substance. The laser recording material may be any of the materials previously discussed. A protective coating 76 is applied over the laser recording material.

Figure 3:
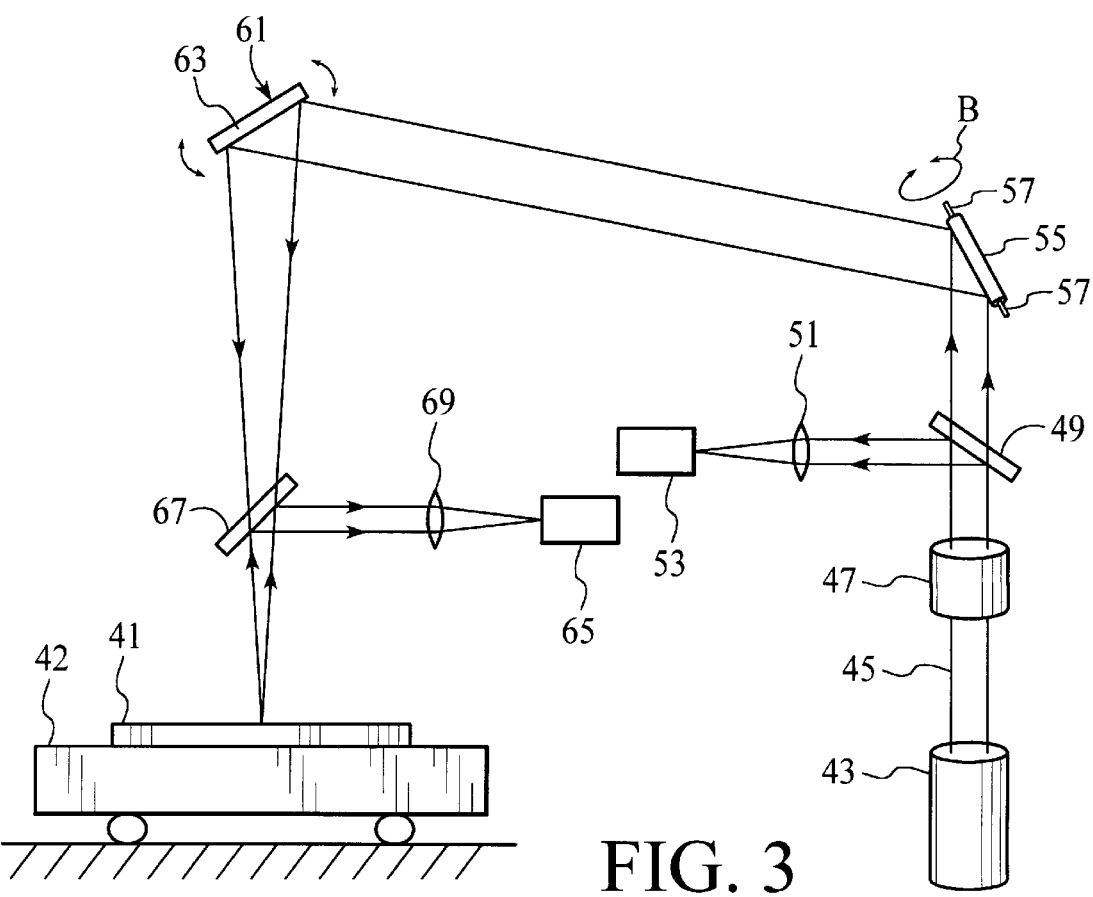
FIG. 3 is a diagrammatic plan of a system for reading and writing the data card of FIG. 1.

A laser writing apparatus is illustrated in FIG. 3 which illustrates the side view of the lengthwise dimension of the medium of FIG. 1 consisting of a data strip having digital information in combination with microscopic data spot information on a card. The data strip portion 41 of the medium is usually received in a movable holder 42 which brings the strip into the trajectory of a laser beam. A laser light source 43, preferably a pulsed semiconductor laser of near infrared or red wavelength emits a beam 45 which passes through collimating and focusing optics 47. The beam is sampled by a beam splitter 49 which transmits a portion of the beam through a focusing lens 51 to a photodetector 53. The detector 53 confirms laser writing. The beam is then directed to a first servo controlled mirror 55 which is mounted for rotation along axis 57 in the direction indicated by arrows B. The purpose of the mirror 55 is to find the lateral edges of the data strip in a coarse mode of operation and then in a fine mode of operation identify data paths or sites which exist predetermined distances from the edges.

From mirror 55, the beam is directed toward a mirror 61. This mirror is mounted for rotation at pivot 63. The purpose of mirror 55 is for fine control of motion of the beam along the length of the data strip. Coarse control of the lengthwise portion of the data strip relative to the beam is achieved by motion of the movable holder 42. The position of the holder may be established by a linear motor and used by a closed loop position servo system of the type used in magnetic disk drives. Reference position information in the form of reflective data tracks is prerecorded or pre-formatted on the card so that position error signals may be generated and used as feedback in motor control. Upon reading one data path, the mirror 55 is slightly rotated. The motor moves holder 42 lengthwise so that the path can be read again, and so on.

For writing microscopic data spots, mirror 55 is used to identify sites at predetermined distances from the edges. Mirror 57 moves the scanning beam lengthwise from site to site. Upon reading one row of sites, mirror 55 is slightly rotated. Within a site, mirrors 55 and 57 cooperate to move the beam in either a zig-zag pattern or a raster-like pattern. Laser data spots are written at designated locations within a data track. When one site is written, mirrors 55 and 57 move the beam to the next site.

As light is scattered and reflected from data spots in the laser recording material, the percentage of reflected light from the incident beam changes relative to surrounding material where no spots exist. The incident laser beam should deliver sufficient laser energy to the surface of the recording material to create microscopic data spots in the data writing mode, but should not cause significant disruption of the surface so as to cause difficulty in the lower beam power data reading mode. The wavelength of the laser should be compatible with the recording material to achieve this purpose. In the read mode, power is approximately 5% to 10% of the recording or writing power.

Differences in reflectivity between a data spot and surrounding material are detected by well-known methods.

For the most common commercial optical memory cards, the recorded data spots are approximately 2.5 microns in diameter; the highly reflective track is 10 microns wide and is separated by low reflectivity, 2-micron wide bands. The reflectivity of the recording track is in the range of 40% to 50%, and the reflectivity of the separating bands and data spots is about 10%.

Figure 4:
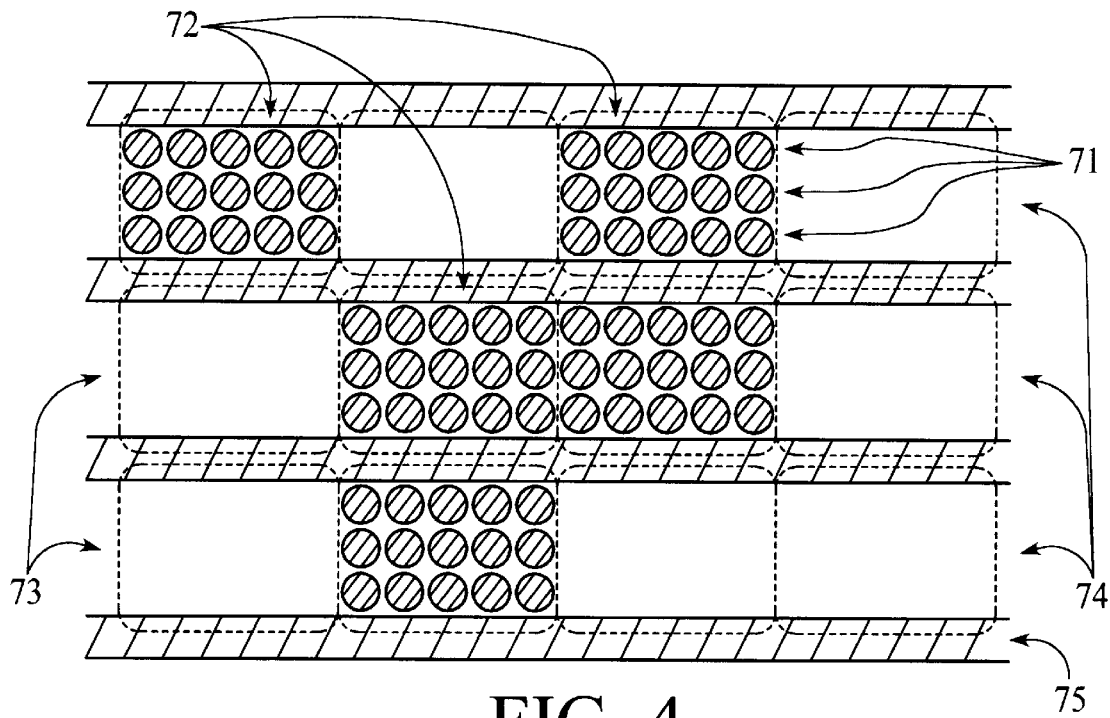
FIG. 4 is a magnified top plan view of the data card shown in FIG. 1.

FIG. 4 illustrates how the microscopic laser-recorded data spots are grouped to form large data pixels capable of being read with photodetector arrays such as CCD arrays. The three 10-micron wide reflective tracks 74 are used to record microscopic data spots 71. The 2-micron wide, low reflectivity bands 75 separate the 10-micron wide reflective data tracks. The low reflectivity large data pixels 72 illustrate how a binary "one" is created by the recording of 15 microscopic spots in a track length section approximately equal to the full track width including separator bands. The group of five data spots in a row is designated a data bar. The high reflectivity large data pixels 73 illustrate how a binary "zero" is created. The contrast ratio between data pixels 72 and data pixels 73 range between 1.5:1 to 2:1. Since the data spots are about 2.5 microns in diameter and there are five in a row, the data pixel dimension is 12.5 microns by 12 microns in size.

Figure 5:
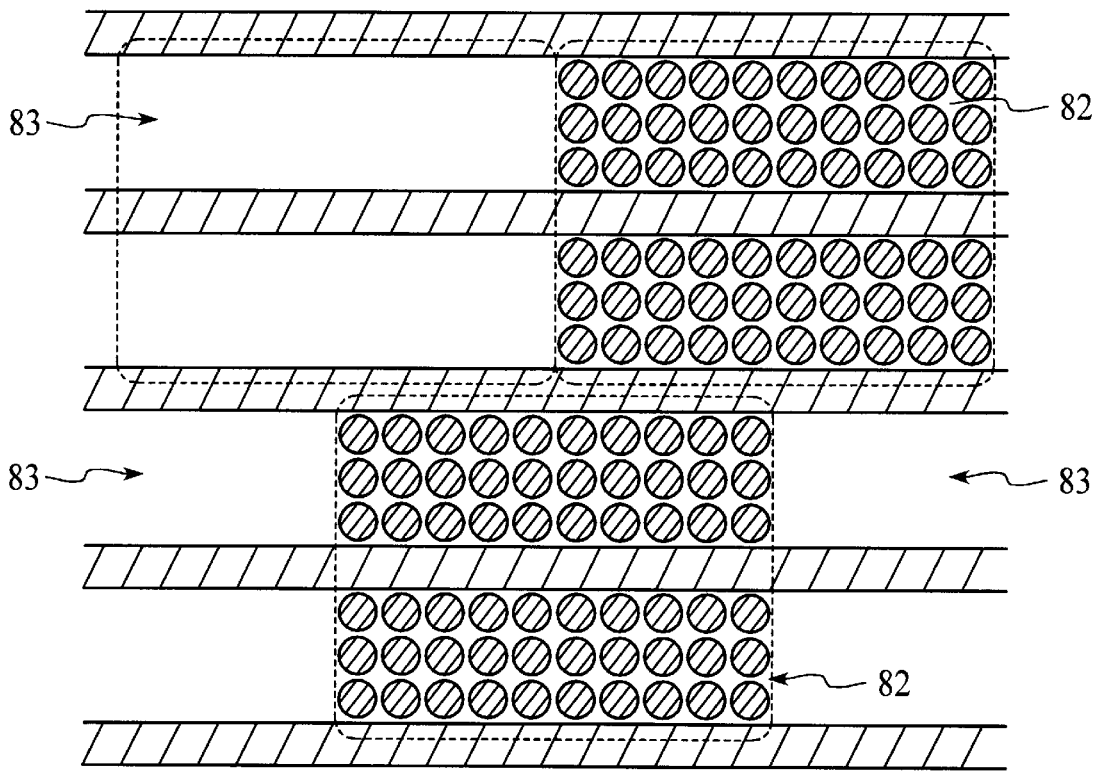
FIG. 5 is another magnified top plan view of the data card shown in FIG. 1.

FIG. 5 is similar to FIG. 4, but the larger data pixel dimensions are 25 microns by 24 microns, exactly twice as big linearly but four times the area of the FIG. 4 data pixels. Note that these data pixels are spread over two tracks whereas those in FIG. 4 occupy one track. Data pixel 82 represents a binary "one," and data pixel 83 represents a binary "zero."

Figure 6:
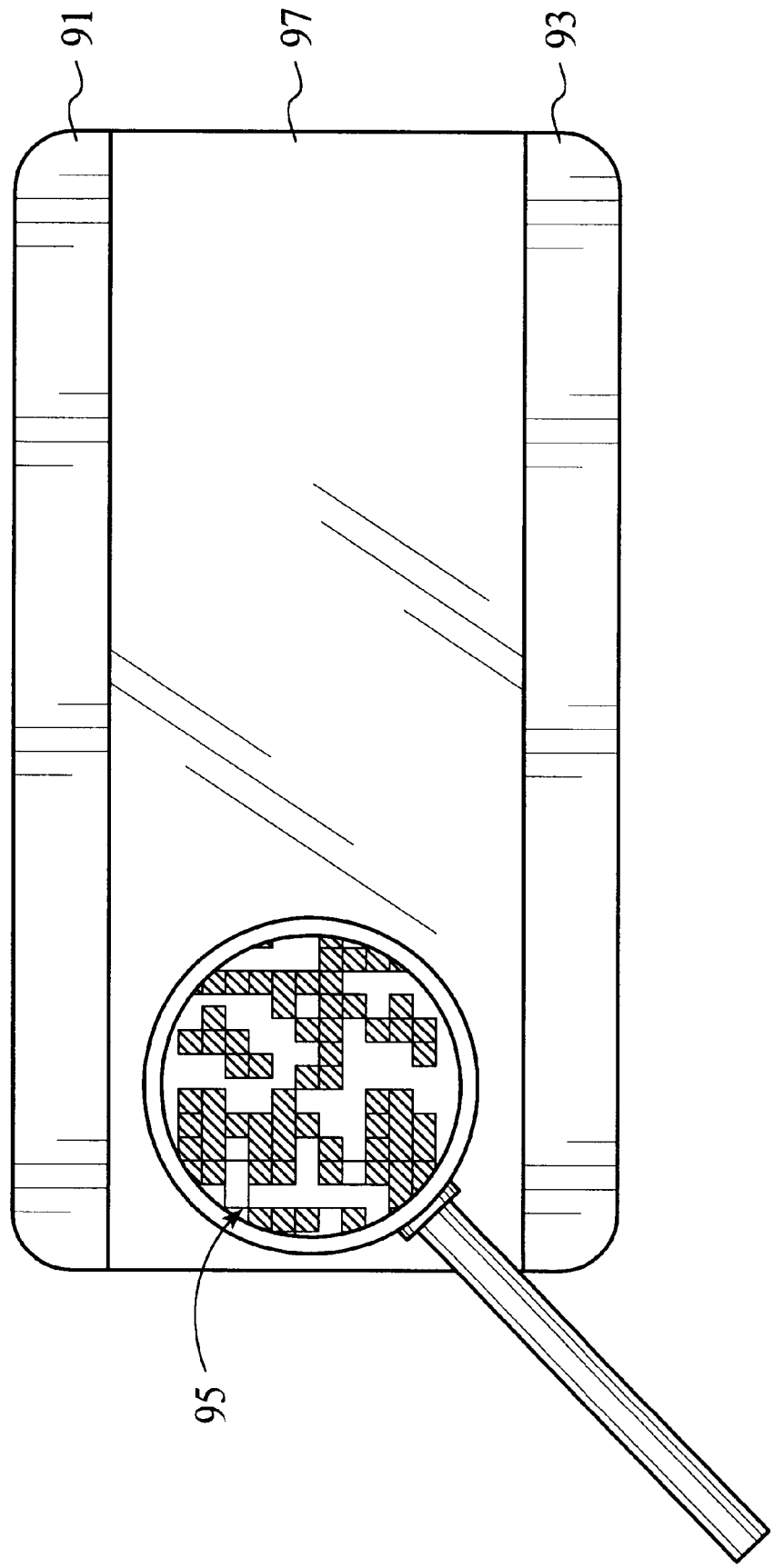
FIG. 6 is an eye readable version of a magnified data card shown in FIG. 1.

FIG. 6 illustrates an optical memory card 91 containing binary "ones" and "zeros" in a pattern that can be called a quad-density data format 95 as described in U.S. Pat. Nos. 4,634,850 and 4,786,792 assigned to Drexler Technology Corporation. Substrate 93 carries optical memory strip 97. The dimensions of the data pixels of the present invention fall within the upper range of the preferred linear dimensions of those two patents, namely, 10 microns to 35 microns. The method of reading such quad-density patterns with linear CCD arrays is explained in detail in those two patents. A key point is that to minimize errors at least two photosensitive detectors in the photodetector or CCD array should view each data pixel. Thus to be practical, at least three such photodetectors should be used. To read the data pixels with linear photodetectors or CCD arrays, there must be linear motion of the card and its quad-density pattern across the photodetectors as explained in the two referenced quad-density-related patents. Also, under selected system design conditions, two-dimensional photodetector arrays such as CCD arrays can be used to read encoded stationary optical memory cards by the techniques described in U.S. Pat. Nos. 4,745,484 and 4,864,630. Also, note that the quad-density format patterns of the present invention use data pixel sizes about one order of magnitude smaller than the similar appearing PDF-417 two-dimensional bar code patterns whose smallest pixel size appears to be about 150 microns.

What is claimed is:

1. A method of creating digital data pixels readable with CCD arrays from laser-written, microscopic data spots comprising, generating an optical beam capable of recording microscopic data spots on an optical data storage medium, the spots having a characteristic width, providing a DRAW (direct-read-after-write) optical data storage medium capable of being laser-recorded with said microscopic data spots, pre-formatting said medium with tracks for recording said data spots where the track has a characteristic width sufficient to accommodate two to six of said data spots if they were arranged in close proximity to one another in a column across said track width, optically recording a row of said data spots along and within a first track in a manner so as to form a first laser-recorded data bar which has the width of said data spots and a length of approximately one to two times the track width, laser recording one to five more data bars parallel and adjacent to said first data bar within the width of the same track and having a length similar to that of the first data bar, and identifying one data pixel among many data pixels as a region whose smallest dimension is at least seven microns on said optical storage medium and which encompasses two to six of said data bars and that portion of said track that contains said data bars.

2. The method of claim 1 where said optical data storage medium is disposed on one of optical memory cards, label tape and individual labels.

3. A method of creating digital data pixels readable with CCD arrays from laser-written, microscopic data spots comprising, providing a laser capable of recording microscopic data spots on a DRAW (direct-read-after-write) optical data storage medium, pre-formatting said medium with tracks for recording said data spots where the track is wide enough to accommodate two to six said data spots if they were arranged in close proximity to one another in a column across said track width, laser recording a row of said data spots along and within a first track such that said spots form a first laser-recorded data bar which has the width of said data spots and a length of approximately two to four times the track width, laser recording one to five more data bars parallel and adjacent to said first data bar within the width of the same first track and having a length similar to that of the first data bar, laser recording in a second track adjacent to the first track two to six data bars of similar widths and lengths to those in the first track, and identifying one data pixel among many data pixels as a region whose smallest dimension is at least seven microns on said optical storage medium and which encompasses four to twelve of said data bars in the first and second tracks and that portion of the two tracks containing said data bars.

4. The method of claim 3 where said optical data storage medium is disposed on one of optical memory cards, label tape and individual labels.

5. A method of creating digital data pixels readable with CCD arrays from laser-written, microscopic data spots comprising, providing a laser capable of recording microscopic data spots on a DRAW (direct-read-after-write) optical data storage medium, pre-formatting said medium with tracks for recording said data spots where the track is wide enough to accommodate two to six said data spots if they were arranged in close proximity to one another in a column across said track width, laser recording a row of said data spots along and within a first track such that said spots form a first laser-recorded data bar which has the width of said data spots and a length of approximately three to six times the track width, laser recording one to five more data bars parallel and adjacent to said first data bar within the width of the same first track and having a length similar to that of the first data bar, laser recording two to six data bars of similar widths and lengths to those in a second track adjacent to the first track and two to six data bars in a third track which is adjacent to either the first or second track, and identifying one data pixel among many data pixels as a region whose smallest dimension is at least seven microns on said optical storage medium and which encompasses six to eighteen of said data bars in the three tracks and that portion of the three tracks containing said data bars.

6. The method of claim 5 where said optical data storage medium is disposed on one of optical memory cards, label tape and individual labels.

7. A method of creating digital data pixels readable with CCD arrays from laser-written, microscopic data spots comprising, providing a laser capable of recording microscopic data spots on a DRAW (direct-read-after-write) optical data storage medium, pre-formatting said medium with tracks for recording said data spots where the track is wide enough to accommodate two to six said data spots if they were arranged in close proximity to one another in a column across said track width, laser recording a row of said data spots along and within a first track such that said spots form a first laser-recorded data bar which has the width of said data spots and a length of approximately four to eight times the track width, laser recording one to five more data bars parallel and adjacent to said first data bar within the width of the same first track and having a length similar to that of the first data bar, laser recording two to six data bars of similar widths and lengths in each of a second track, third track, and fourth track, which form a group of four adjacent tracks, and identifying one data pixel among many data pixels as a region whose smallest dimension is at least seven microns on said optical storage medium and which encompasses eight to twenty-four of said data bars in the four tracks and that portion of the four tracks containing said data bars.

8. The method of claim 7 where said optical data storage medium is disposed on one of optical memory cards, label tape and individual labels.

9. A method of creating digital data pixels readable with CCD arrays from laser-written, microscopic data spots comprising, provulating a laser capable of recording microscopic data spots on a DRAW (direct-read-after-write) optical data storage medium, pre-formatting said medium with tracks for recording said data spots where the track is wide enough to accommodate two to six said data spots if they were arranged in close proximity to one another in a column across said track width, laser recording a row of said data spots along and within a first track such that said spots are either in close proximity, contiguous, or overlapping one another so as to form a first laser-recorded data bar which has the width of said data spots and a length of approximately five to ten times the track width, laser recording of at least one more data bar adjacent to said first data bar within the width of the same track and having a length similar to that of the first data bar, laser recording two to six data bars of similar widths and lengths in each of a second track, third track, fourth track, and fifth track, which form a group of five adjacent tracks, and identifying one data pixel among many data pixels as a region whose smallest dimension is at least seven microns on said optical storage medium and which encompasses ten to thirty of said data bars in five tracks and that portion of the five tracks containing said data bars.

10. The method of claim 9 where said optical data storage medium is disposed on one of optical memory cards, label tape and individual labels.

11. An updatable optical memory card readable with a photodetector array such as a CCD array comprising a wallet-size card having a strip of optical contrast pre-formatted DRAW laser recording material disposed thereon, a plurality of laser-written microscopic data spots create a plurality of data bars recorded on said strip with at least two said data bars on each track having a track width at least three times greater than the width of the data bars and the combination of at least two adjacent tracks having said data bars recorded thereon, forming a data pixel among many data pixels as a region whose smallest dimension is at least seven microns and which encompasses at least 2n data bars which are approximately n to 2n track widths long and that portion of the n tracks encompassed containing at least 2n said data bars, and where said data pixels are capable of being read with a photodetector array such as a CCD array.

12. The updatable optical memory card of claim 11 where the number of tracks n can range from one to ten.

13. The updatable optical memory card of claim 11 where the data pixel linear size dimension ranges from approximately one track width to ten times the track width.

14. The updatable optical memory card of claim 11 where said card is updatable both in writing and reading numerous series of microscopic data spots and in writing and reading numerous series of data pixels on the same card or different cards.

15. The updatable optical memory card of claim 11 where some of the data recorded in microscopic data spots on said card is also recorded redundantly on the same card using data pixels which are at least twice as large as said microscopic data spots.

16. An optical memory label tape or individual labels for attaching to documents and manufactured products comprising a strip of optical contrast pre-formatted DRAW laser recording material in the form of single or multiple labels in the form of a tape, a plurality of laser-written microscopic data spots create a plurality of data bars recorded on said strip with at least two said data bars on each track having a track width at least three times greater than the width of the data bars and the combination of at least two adjacent tracks having said data bars recorded thereon, forming a data pixel among many data pixels as a region whose smallest dimension is at least seven microns, that encompasses at least 2n data bars which are approximately n to 2n track widths long and that portion of the n tracks encompassed containing at least 2n said data bars, and where said data pixels are capable of being read with a photodetector array such as a CCD array.

17. The optical memory label of claim 16 where the number of tracks n can range from one to ten.

18. The optical memory label of claim 16 where the data pixel linear size dimension ranges from approximately one track width to ten times the track width.

19. The optical memory label tape or individual labels of claim 16 which are utilized for authentication, validation, authorization, or identification of said documents or manufactured products.

20. The optical memory label tape or individual labels of claim 16 where the labels that comprise the tape or the individual labels have serial numbers or other features that distinguish one label from another label.

* * * * *